US007638703B2

(12) United States Patent
Lee

(10) Patent No.: US 7,638,703 B2
(45) Date of Patent: Dec. 29, 2009

(54) METHOD AND SYSTEM OF AUDIO SYNTHESIS CAPABLE OF REDUCING CPU LOAD

(75) Inventor: Chung-Hsinen Lee, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 1484 days.

(21) Appl. No.: 10/730,130

(22) Filed: Dec. 9, 2003

(65) Prior Publication Data

US 2004/0240674 A1 Dec. 2, 2004

(30) Foreign Application Priority Data

Jun. 2, 2003 (TW) .............................. 92114939 A

(51) Int. Cl.
*G10H 1/04* (2006.01)
*G10H 6/00* (2006.01)
*G10H 7/00* (2006.01)
*H03C 1/00* (2006.01)

(52) U.S. Cl. .......................................... 84/624; 84/627

(58) Field of Classification Search .................. 84/626, 84/627, 624, 663
See application file for complete search history.

(56) References Cited

U.S. PATENT DOCUMENTS

| | | | | |
|---|---|---|---|---|
| 4,406,204 | A * | 9/1983 | Katoh | 84/119 |
| 4,813,326 | A * | 3/1989 | Hirano et al. | 84/624 |
| 4,868,869 | A * | 9/1989 | Kramer | 381/61 |
| 4,991,218 | A * | 2/1991 | Kramer | 381/61 |
| 5,243,124 | A * | 9/1993 | Kondratiuk et al. | 84/624 |
| 5,619,002 | A * | 4/1997 | Walck | 84/603 |
| 5,861,568 | A * | 1/1999 | Abreu et al. | 84/624 |
| 2004/0240673 | A1 * | 12/2004 | Lee | 381/2 |
| 2007/0079689 | A1 * | 4/2007 | Saado et al. | 84/604 |

* cited by examiner

*Primary Examiner*—Jeffrey Donels
(74) *Attorney, Agent, or Firm*—Bacon & Thomas, PLLC

(57) ABSTRACT

A method and system of audio synthesis capable of reducing CPU load is disclosed, which establishes a parameter look-up table in a read-only memory (ROM). When a computer system synthesizes audio signals, the required coefficients are obtained from the table, which relatively reduces the amount of parameter transferred between an audio chip and a central processing unit (CPU). Thus, the load of the CPU can be reduced.

14 Claims, 7 Drawing Sheets

| WAVE PARAMETER | | MODULATION PARAMETER | | | | | CONTROL PARAMETER | | | |
|---|---|---|---|---|---|---|---|---|---|---|
| TIMBRE | SCALE | $\omega_m$ | I(t) | $\omega_c t$ | A(t) | TC | ATTACK | DECAY | SUSTAIN | RELEASE |
| PIANO | DO | 1500 | 2t | 2500 | 4t | 1 | +2t | -1(t-5) | 1 | -4(t-10) |
| PIANO | RE | 1500 | 2t | 2500 | 4t | 1 | +3t | -2(t-6) | 0 | -4(t-12) |
| PIANO | MI | 1500 | 2t | 2500 | 4t | 1 | +4t | -2(t-5) | 3 | -5(t-13) |
| PIANO | FA | 1500 | 2t | 2500 | 4t | 1 | +5t | -4(t-3) | 2 | -6(t-11) |
| PIANO | SO | 1500 | 2t | 2500 | 4t | 1 | +6t | -3(t-4) | 1 | -5(t-9) |
| PIANO | LA | 1500 | 2t | 2500 | 4t | 1 | +7t | -5(t-2) | 2 | -6(t-11) |

FIG. 10

METHOD AND SYSTEM OF AUDIO SYNTHESIS CAPABLE OF REDUCING CPU LOAD

BACKGROUND OF THE INVENTION

1. Field of the Invention

The present invention relates to a method and system of audio synthesis and, more particularly, to a method and system of audio synthesis capable of reducing CPU load.

2. Description of Related Art

In current audio syntheses, a synthetic audio is generated by performing frequency modulation based on huge mathematical calculation by an audio synthesizer after communicating a lot of audio coefficients required by the synthesis with corresponding hardware, and output to a speaker for playing.

FIG. 1 is a block diagram of a typical audio synthesizer 80. The audio synthesizer 80 can be divided into three circuit-based sections: a modulation circuit 10 (FIG. 2), a controller 40, and an output circuit 50. The modulation circuit 10 can be implemented in many ways, for example, U.S. Pat. No. 4,813,326 granted to Hirano et al. for a "Method and apparatus for synthesizing music tones with high harmonic content", as shown in FIG. 2, is provided to generate desired audio synthesis based on a predetermined modulation. The predetermined modulation can be frequency modulation (FM) or amplitude modulation (AM). An example is given in FM. For representing a modulating wave (assume that the timbre is piano) as an equation $A(t)*SIN(\omega_c t+I(t)*SIN\ \omega_m t)$, it only requires inputting modulation parameters to the modulation circuit 10. Thus, the timbre's wave is produced. Further, the modulation parameters includes modulating wave phase angle data $\omega_m t$, modulation wave data I(t), carrier phase angle data $\omega_c t$, amplitude coefficient signal A(t) and tone color selection signal TC. Accordingly, the circuit 10 finally generates modulating wave shown in FIG. 3, which is the timbre of piano. However, the modulating wave is periodically repeated to present only a corresponding timbre. Different sounds of a timbre are generated only when the modulating wave is further input to the controller 40 to generate an audio wave.

FIG. 4 is a schematic diagram of control parameters for an exemplary 'DO' scale of FIG. 3. FIG. 5 shows an audio wave outputted by the controller 40 for the control parameters of FIG. 4. The control parameters include four kinds: attack, decay, sustain and release. The attack parameter amplifies the amplitude of the modulating wave. The decay parameter weakens the amplitude of the modulating wave. The sustain parameter nearly keeps on the amplitude of the modulating wave. The release parameter fades away the amplitude. When the controller 40 receives the modulating wave and applies the parameters to the modulating wave, as shown in FIG. 5, the audio wave of 'DO' scale for the timbre of piano is outputted.

The audio wave requires further generating left channel synthetic audio L and right channel synthetic audio R through the output circuit 50. The output circuit 50 receives the audio wave and modulates it based on characteristic parameters, to output the audio L and R. The characteristic parameters include mute parameter Mute, volume control parameter VoCol, channel control parameter ChCol, left selection parameter L-Col and right selection parameter R-Col. The parameter Mute determines whether or not each audio wave is outputted. The parameter VoCol adjusts current volume of an audio wave. The parameter ChCol determines if the audio wave is output. The parameters L-Col and R-Col control an output ratio of left to right channels of the audio wave. Finally, the left audio L and another left audio L' generated by output circuits 50 of another channels are added, and similarly the right audio R and another right audio R' are added, thus generating and outputting the synthetic audio.

FIG. 6 is a block diagram of a typical computer system performing audio synthesis. In the computer system, the cited modulation, control and characteristic parameters are outputted by a CPU 32 to an audio chip 30 (implemented on a sound card). The audio chip 30 has an internal audio synthesizer 80 for FM processing. The audio synthesized by the chip 30 is outputted to a speaker 34 for appropriate sound output. This is shown in a flowchart of FIG. 7. As shown in FIG. 7, modulation parameter, control parameter and property parameter are outputted from a CPU 32 to an audio chip 30 (step S70). In step S72, the audio chip 30 generates and outputs a synthetic audio based on the cited parameters. In step S74, the speaker 34 sounds based on the synthetic audio.

As cited, for audio synthesis, the CPU 32 requires transmitting the modulation parameter, the control parameter and the characteristic parameter to the audio chip 30. Thus, huge data transmission between the devices 32 and 30 is required, and the performance of the CPU 32 is reduced because the reading, calculating and outputting operations for parameters largely add the load of the CPU 32. Therefore, it is desirable to provide an improved method to mitigate and/or obviate the aforementioned problems.

SUMMARY OF THE INVENTION

An object of the present invention is to provide a method of audio synthesis, which can reduce central processing unit (CPU) load on audio synthesis.

Another object of the present invention is to provide a method of audio synthesis, which can reduce required data communication between a CPU and an audio chip.

A further object of the present invention is to provide a system of audio synthesis, which can reduce CPU load on audio synthesis.

Another further object of the present invention is to provide a system of audio synthesis, which can reduce required data communication between a central processing unit (CPU) and an audio chip.

In accordance with one aspect of the invention, there is provided a method of audio synthesis, which applies frequency modulation for processing audio to output a synthetic audio. The method includes: establishing a parameter look-up table, outputting a wave parameter and a property parameter from a microprocessor to an audio processor, extracting a modulation parameter and a control parameter from the parameter look-up table based on the wave parameter by the audio processor, and applying frequency modulation to generate the synthetic audio by the audio processor based on the modulation parameter, the control parameter and the property parameter.

In accordance with another aspect of the invention, there is provided a system of audio synthesis, which applies frequency modulation for processing audio to output a synthetic audio. The system includes: a microprocessor to output a wave parameter and a property parameter, a memory to store a parameter look-up table of which records a modulation parameter and control parameter corresponding to the wave parameter, and an audio processor to input the wave parameter and the property parameter for reading the modulation parameter and the control parameter from the parameter look-up table based on the wave parameter and further performing frequency modulation to produce the synthetic audio based on the modulation parameter, the control parameter, and the property parameter.

Other objects, advantages, and novel features of the invention will become more apparent from the following detailed description when taken in conjunction with the accompanying drawings.

BRIEF DESCRIPTION OF THE DRAWINGS

FIG. 10 is a parameter look-up table in accordance with the invention.

DETAILED DESCRIPTION OF THE PREFERRED EMBODIMENT

Figure 1:
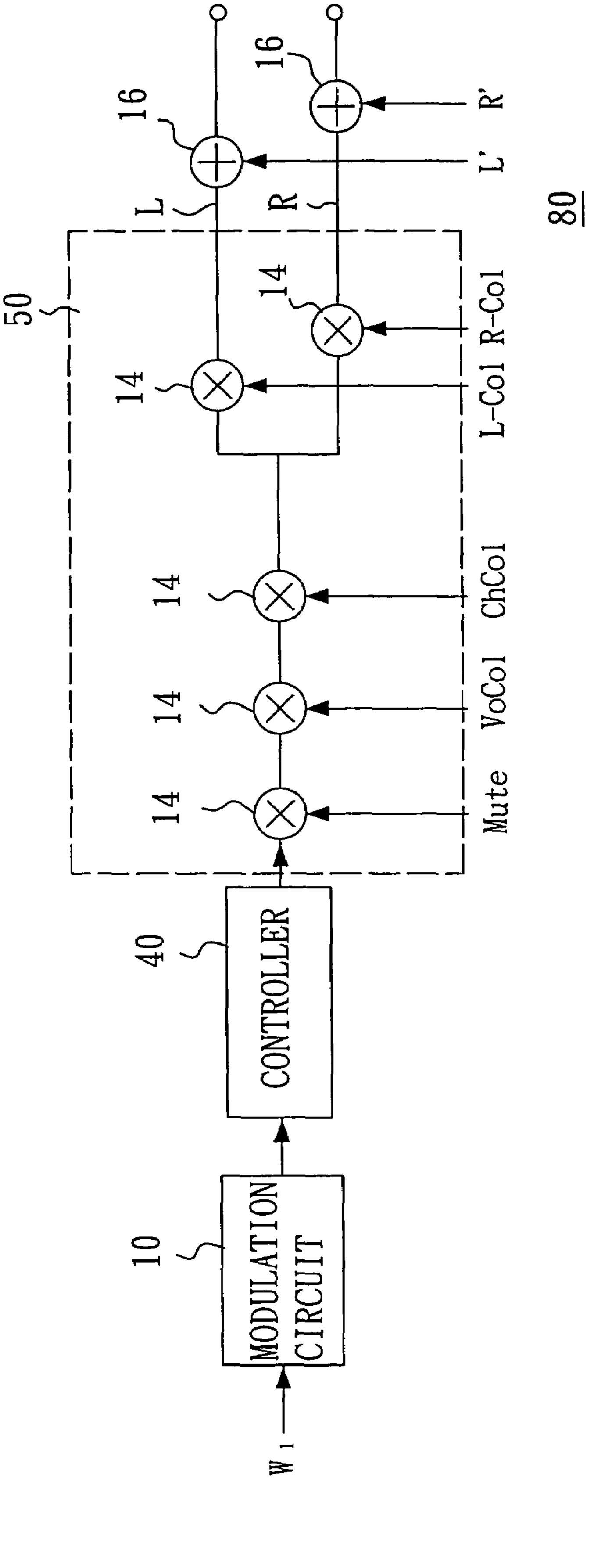
FIG. 1 (PRIOR ART)
FIG. 1 is a block diagram of a typical audio synthesizer.
Figure 2:
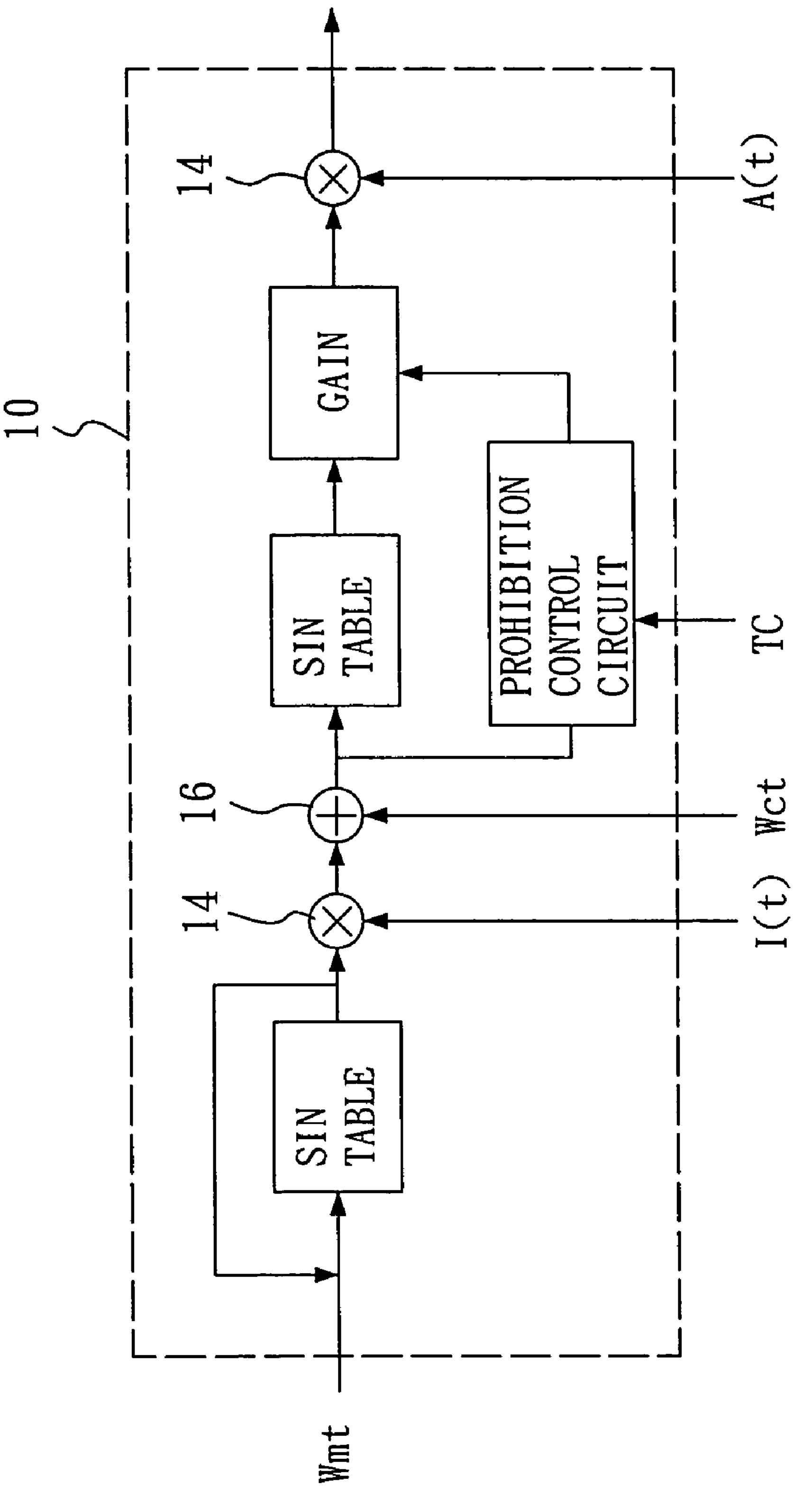
FIG. 2(PRIOR ART)
FIG. 2 is a block diagram of a typical modulation circuit.
Figure 3:
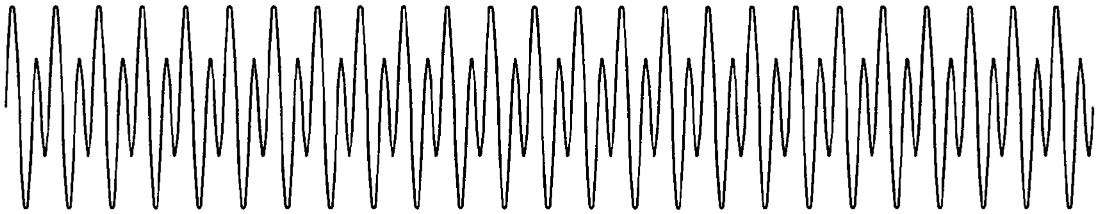
FIG. 3(PRIOR ART)
FIG. 3 is a schematic view of a modulating wave generated by the typical modulation circuit of FIG. 3.
Figure 4:
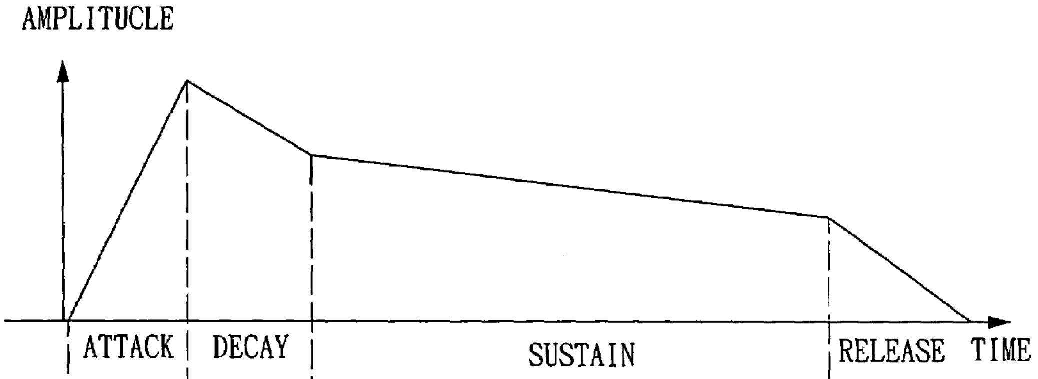
FIG. 4(PRIOR ART)
FIG. 4 is a schematic diagram of control parameters for an exemplary 'DO' scale of FIG. 3.
Figure 5:
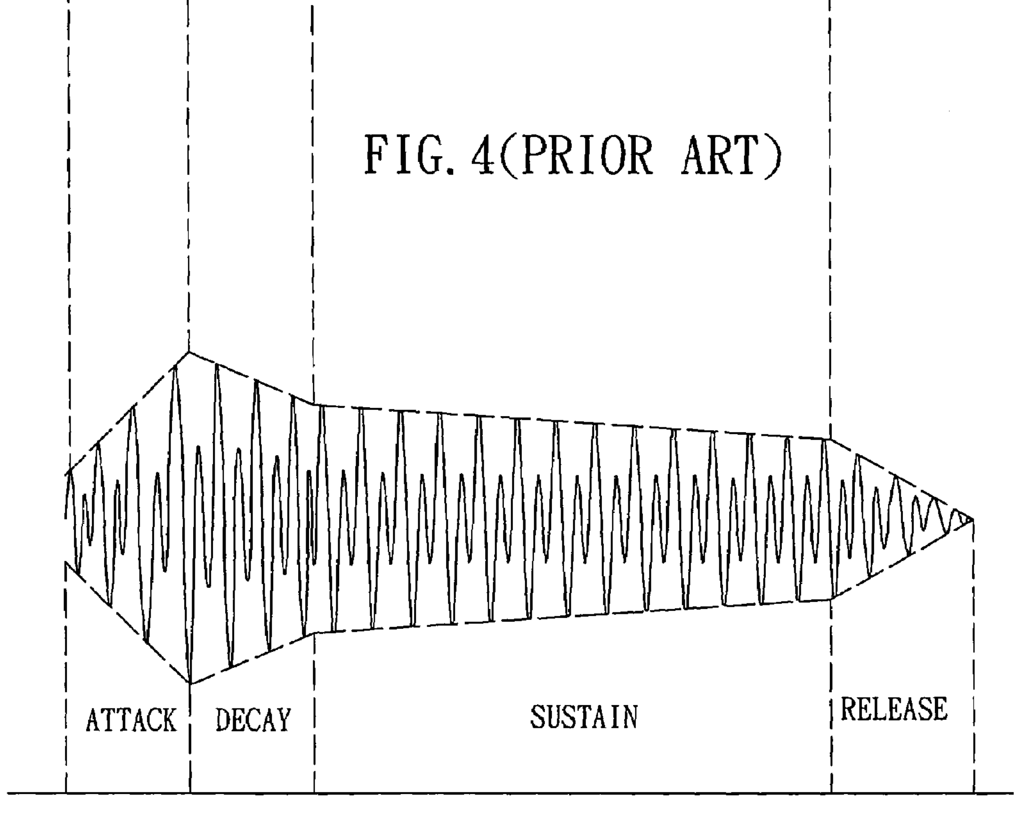
FIG. 5(PRIOR ART)
FIG. 5 shows an audio wave output by the controller 40 for the control parameters of FIG. 4.
Figure 6:
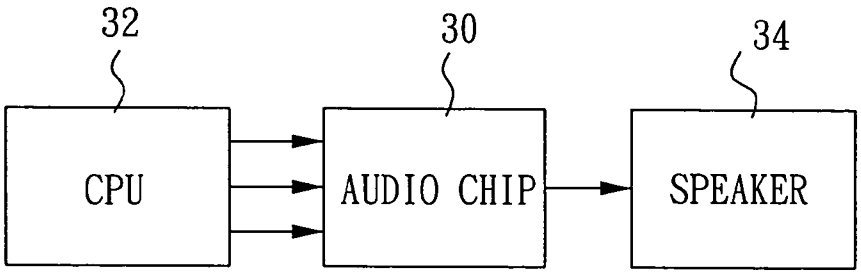
FIG. 6 is a block diagram of a typical computer system for audio synthesis.
Figure 7:
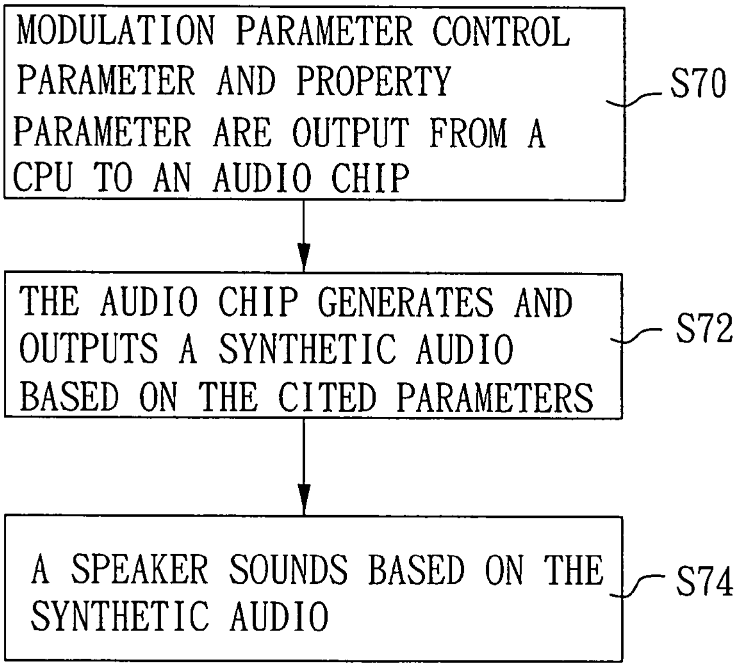
FIG. 7 is a flowchart of audio synthesis processed by the typical computer system of FIG. 6.
Figure 8:
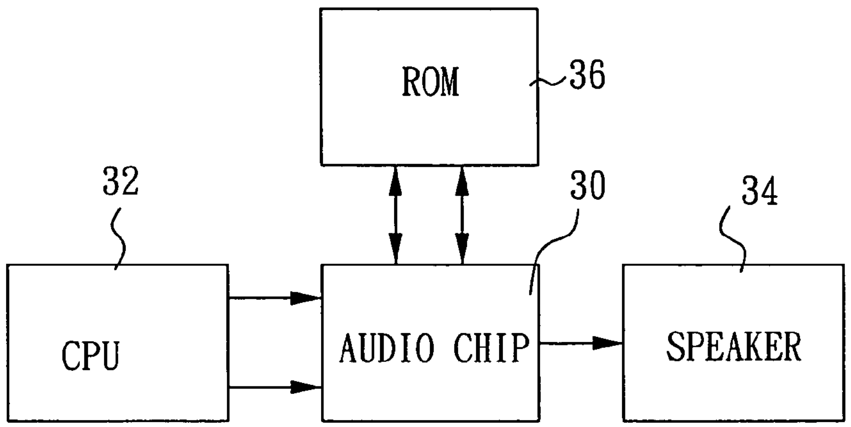
FIG. 8 is a block diagram of a computer system for audio synthesis in accordance with the invention.
Figure 9:
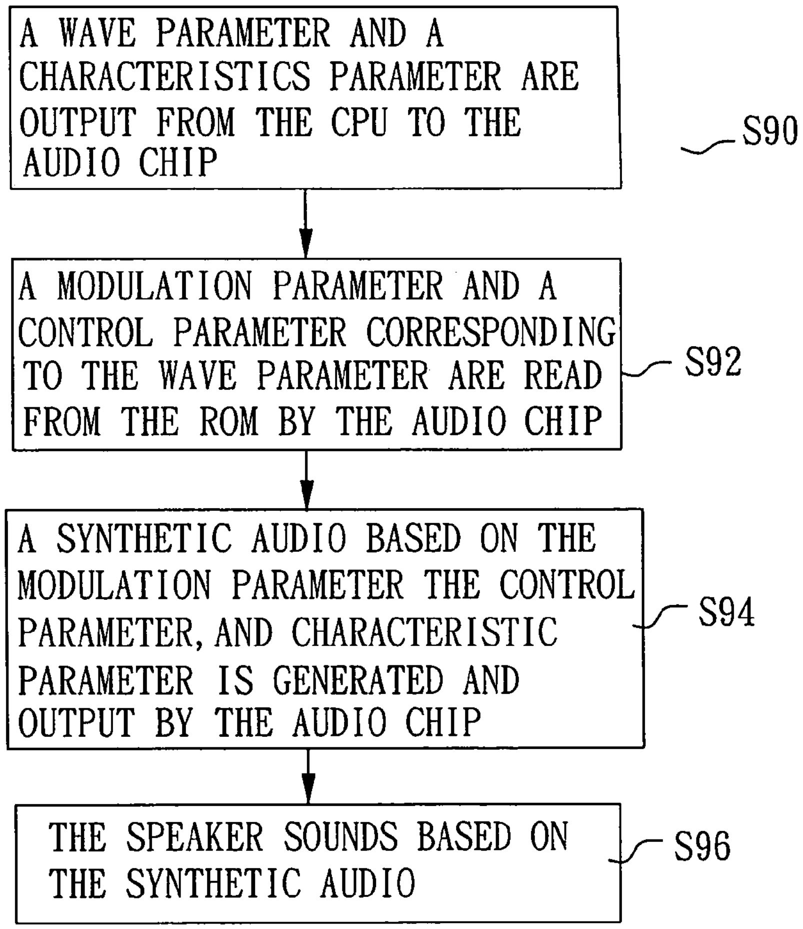
FIG. 9 is a flowchart of audio synthesis processed by the computer system of FIG. 8 in accordance with the invention.

FIGS. 8 and 9 respectively illustrate a computer system and corresponding audio synthesis in accordance with the present invention, wherein devices with the same or similar functions have the same number.

As shown, a parameter look-up table is first established in a read-only memory (ROM) 36. The content of the table is given, but not limited to, in a simple illustration of FIG. 10. As shown in FIG. 10, the table has wave parameters and the corresponding modulation parameters and control parameters. Each wave parameter can be divided into a timbre parameter and a sound parameter. The timbre parameter presents a tone color such as a piano, corresponding to a modulation parameter. The sound parameter presents a scale such as 'DO' scale, corresponding to a control parameter. The modulation parameter and the control parameter respectively have the same functions as in the prior art. That is, the modulation parameter is used to generate a modulating wave and the control parameter is used to generate an audio wave. In addition, the table can also be stored in a flash memory, a PROM or the like.

The method of the present invention performs audio synthesis by applying FM technique, which includes, as shown in FIG. 9, the following steps.

In step S90, a wave parameter and a characteristic parameter are output from the CPU 32 to the audio chip 30. The wave parameter includes a timbre parameter and a sound (scale) parameter respectively corresponding to a modulation parameter and a control parameter.

In step S92, the modulation parameter and the control parameter corresponding to the wave parameter are read from the ROM 36 by the audio chip 30. When the audio chip 30 receives the wave parameter from the CPU 32, the timbre parameter and the scale parameter are extracted from the wave parameter, and the modulation parameter and the control parameter corresponding to the wave parameter are read from the parameter look-up table (stored in ROM 36). For example, a timbre parameter and a scale parameter of the wave parameter are piano and 'DO' respectively. In this case, the piano timbre parameter corresponds to a modulation parameter having modulating wave phase angle data $\omega_m t$ 1500, modulation wave data I(t) 2t, carrier phase angle data $\omega_c t$ 2500, amplitude coefficient signal A(t) 4t, and tone color selection signal TC 1. Also, in this case, the 'DO' scale parameter corresponds to a control parameter having attack +2t, decay −1(t−5), sustain 1 and release −4(t−10). However, modulation parameters and control parameters stored in the parameter look-up table depend on actual applications, not limited to the above example.

In step S94, a synthetic audio is generated and outputted by the audio chip 30 based on the modulation parameter, the control parameter and the characteristic parameter. The audio chip 30 synthesizes audio using FM technique. As cited, the audio chip 30 uses the modulation parameter, the control parameter and the characteristic parameter to generate the synthetic audio and output the synthetic audio to the speaker 34.

In step S96, the speaker 34 produces sound based on the synthetic audio.

In this invention, data transmission between the CPU 32 and the audio chip 30 requires only wave parameters and characteristic parameters because modulation parameters and control parameters are from the parameter look-up table (based on corresponding wave parameters), so that the data transmission amount is less than that in the prior art (in this example, 7 parameters are removed). Therefore, the load of the CPU 32 is greatly reduced.

Furthermore, since modulation parameters and control parameters are stored in the ROM 36, as compared to storing them in registers of the CPU 32 or the audio chip 34, system resource is saved and audio synthesis system costs less.

Although the present invention has been explained in relation to its preferred embodiment, it is to be understood that many other possible modifications and variations can be made without departing from the spirit and scope of the invention as hereinafter claimed.

What is claimed is:

1. A method of audio synthesis capable of reducing CPU load, which uses frequency modulation (FM) to generate a synthetic audio, comprising the steps:

establishing a parameter look-up table;

outputting a wave parameter and a characteristic parameter from a microprocessor to an audio processor;

extracting a modulation parameter and a control parameter from the parameter look-up table by the audio processor based on the wave parameter; and performing frequency modulation to generate the synthetic audio by the audio processor based on the modulation parameter, the control parameter and characteristic parameter.

2. The method as claimed in claim 1, wherein the parameter look-up table is stored in a read-only memory (ROM).

3. The method as claimed in claim 1, wherein the wave parameter includes a timbre parameter and a scale parameter.

4. The method as claimed in claim 3, wherein the timbre parameter is corresponding to the modulation parameter.

5. The method as claimed in claim 3, wherein the scale parameter is corresponding to the control parameter.

6. The method as claimed in claim 1, wherein the microprocessor is a central processing unit (CPU).

7. The method as claimed in claim 1, wherein the audio processor is implemented in a sound card.

8. A system of audio synthesis capable of reducing CPU load, which uses frequency modulation to generate a synthetic audio, comprising:

a microprocessor, to output a wave parameter and a characteristic parameter;

a memory, to store a parameter look-up table of which records a modulation parameter and control parameter corresponding to the wave parameter; and an audio processor, to input the wave parameter and the characteristic parameter for reading the modulation parameter and the control parameter from the parameter look-up table based on the wave parameter and further performing frequency modulation to produce the synthetic audio based on the modulation parameter, the control parameter, and the property parameter.

9. The system as claimed in claim 8, wherein the microprocessor is a central processing unit (CPU).

10. The system as claimed in claim 8, wherein the audio processor is implemented in a sound card.

11. The system as claimed in claim 8, wherein the wave parameter includes a timbre parameter and a scale parameter.

12. The system as claimed in claim 8, wherein the memory is a ROM.

13. The system as claimed in claim 11, wherein the timbre parameter is corresponding to the modulation parameter.

14. The system as claimed in claim 11, wherein the scale parameter is corresponding to the control parameter.

* * * * *

UNITED STATES PATENT AND TRADEMARK OFFICE

CERTIFICATE OF CORRECTION

PATENT NO. : 7,638,703 B2
APPLICATION NO. : 10/730130
DATED : December 29, 2009
INVENTOR(S) : Chung-Hsinen Lee It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1784 days.

Signed and Sealed this

Twenty-first Day of December, 2010

David J. Kappos

*Director of the United States Patent and Trademark Office*